United States Patent
Cerusa et al.

(10) Patent No.: US 7,586,429 B1
(45) Date of Patent: Sep. 8, 2009

(54) SCRAMBLING SYSTEM FOR HIGH RESOLUTION DITIGAL-TO-ANALOG CONVERTER

(75) Inventors: Giovanni Antonio Cerusa, Cremona (IT); Alessandro Bosi, Gadesco (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/789,196

(22) Filed: Apr. 24, 2007

Related U.S. Application Data

(60) Provisional application No. 60/798,912, filed on May 9, 2006.

(51) Int. Cl.
*H03M 1/66* (2006.01)

(52) U.S. Cl. .................. 341/144; 341/143; 341/148; 341/118; 345/87; 345/88; 345/92; 345/97; 345/100

(58) Field of Classification Search ......... 341/144–154; 345/89–92, 97, 100, 204, 216
See application file for complete search history.

(56) References Cited

U.S. PATENT DOCUMENTS

| | | | | |
|---|---|---|---|---|
| 6,124,813 | A * | 9/2000 | Robertson et al. | 341/143 |
| 6,154,157 | A * | 11/2000 | Wong | 341/110 |
| 6,545,623 | B1 * | 4/2003 | Yu | 341/155 |
| 6,639,530 | B2 * | 10/2003 | Jensen et al. | 341/143 |
| 6,778,119 | B2 * | 8/2004 | May | 341/144 |
| 6,867,718 | B2 * | 3/2005 | Cesura et al. | 341/118 |
| 6,888,487 | B2 * | 5/2005 | Cretti et al. | 341/144 |
| 6,930,626 | B2 * | 8/2005 | Brooks et al. | 341/143 |
| 7,046,181 | B2 * | 5/2006 | Schofield | 341/144 |
| 7,180,495 | B1 * | 2/2007 | Matsueda | 345/98 |
| 7,239,258 | B2 * | 7/2007 | Grosso et al. | 341/139 |
| 2003/0001764 | A1 * | 1/2003 | Ruha et al. | 341/144 |
| 2005/0012650 | A1 * | 1/2005 | Cretti et al. | 341/144 |
| 2006/0139193 | A1 * | 6/2006 | Morrow et al. | 341/143 |

OTHER PUBLICATIONS

Deveugele, Jurgen et al; A 10-bit 250-MS/s Binary-Weighted Current-Steering DAC; IEEE Journal of Solid-State Circuits, vol. 41, No. 2, Feb. 2006; pp. 320-329.

Shu, Tzi-Hsiung et al; A 13-b 10-Msample/s ADC Digitally Calibrated with Oversampling Delta-Sigma Converter; IEEE Journal of Solid-State Circuits, vol. 30, No. 4, Apr. 1995; pp. 443-452.

Cong, Yonghua et al; A 1.5-V 14-Bit 100-MS/s Self-Calibrated DAC; IEEE Journal of Solid-State Circuits, vol. 38, No. 12, Dec. 2003; pp. 2051-2060.

Deveugele, Jurgen et al; "A Gradient-Error and Edge-Effect Tolerant Switching Scheme for a High-Accuracy DAC"; IEEE Transactions on Circuits and Systems—I: Regular Papers, vol. 51, No. 1, Jan. 2004; pp. 191-195.

Van der Plas, Geert A. M. et al; "A 14-bit Intrinsic Accuracy Q2 Random Walk CMOS DAC"; IEEE Journal of Solid-State Circuits, vol. 34, No. 12, Dec. 1999; pp. 1708-1718.

Schofield, W. et al; "7.1 A 16b 400MS/s DAC with <-80dBc IMD to 300MHz and <-160dBm/Hz Noise Power Spectral Density"; ISSCC 2003/Session 7/DACs and AMPs/Paper 7.1; Sep. 2003; 10 pages.

* cited by examiner

*Primary Examiner*—Linh V Nguyen

(57) ABSTRACT

A scrambling system for a digital-to-analog converter (DAC) includes a DAC that receives a digital input word and a scrambling module that randomly selects at least one of a plurality of current sources based on the digital input word. The DAC outputs an analog signal based on the at least one of the plurality of current sources.

39 Claims, 16 Drawing Sheets

SCRAMBLING SYSTEM FOR HIGH RESOLUTION DITIGAL-TO-ANALOG CONVERTER

CROSS-REFERENCE TO RELATED APPLICATIONS

This application claims the benefit of U.S. Provisional Application No. 60/798,912, filed on May 9, 2006. The disclosure of the above application is incorporated herein by reference in its entirety.

FIELD

The present disclosure relates to digital-to-analog converters and, more particularly, to improving the performance of current-steering digital-to-analog converters.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Applications involving signal processing such as modern communication systems require high accuracy (e.g. 12-14 bit) and high speed (e.g. above 100 Megahertz) digital-to-analog converters (DACs). Complementary DACs convert digital signals (e.g. binary code) into analog signals (e.g. electrical voltage or current).

Referring now to FIG. 1, an exemplary "current-steering" DAC 10 is shown to include a segmentation module 12, a row/column (R/C) address generating module 14, a binary-thermometer (B/T) row decoder 16, a B/T column decoder 18, a R/C selection module 20, latches and switches matrix module 22, and a current matrix module 24. The DAC 10 converts a binary input word including n bits (e.g. 14 bits) into a corresponding analog signal. The segmentation module 12 receives the binary input word and divides the binary input into b least significant bits (LSBs) and n-b, or m most significant bits (MSBs).

The row/column address generating module 14 generates row and column codes, or addresses, based on the MSBs. The B/T row decoder 16 and the B/T column decoder 18 thermometer decode the row and column codes, respectively. The R/C selection module 20 generates control signals based on the thermometer row codes and column codes received from the B/T row decoder 16 and the B/T column decoder 18, respectively. The control signals activate switches within the latches and switches matrix module 22. Each switch respectively controls a unary current source. Additionally, each switch is grouped to a latch (not shown) within the latches and switches matrix module 22. By coupling a latch to a corresponding switch, timing errors within the DAC 10 are minimized. Typically, the current sources are organized in a current matrix module 24 independent of the latches and switches matrix module 22.

FIG. 2 illustrates exemplary unary current sources I0, I1, I2, I3, and Im, referred to collectively as the current sources, of the DAC 10 where m=($2^n$−1) Each of the current sources generates a substantially constant current. Switches D0, D1, D2, D3, . . . , and Dm correspond to current sources I0, I1, I2, I3, . . . , and Im, respectively. The switches D0, D1, D2, D3, . . . , and Dm respectively receive control signals S0, S1, S2, S3, . . . , and Sm, referred to collectively as the control signals, that selectively drive the switches.

SUMMARY

A scrambling system for a digital-to-analog converter (DAC) includes a DAC that receives a digital input word and a scrambling module that randomly selects at least one of a plurality of current sources based on the digital input word. The DAC outputs an analog signal based on the at least one of the plurality of current sources.

In other features, the scrambling module includes a scrambling row decoder module that decodes and scrambles a row group of bits of the digital input word. The scrambling row decoder module generates a pair of row control signals based on the scrambled row group of bits and the at least one of the plurality of current sources is selected based on the pair of row control signals. The scrambling row decoder module includes a binary-thermometer (B/T) scrambling row decoder module.

In other features, the scrambling module includes a scrambling column decoder module that decodes and scrambles a column group of bits of the digital input word. The scrambling column decoder module generates a column control signal based on the scrambled column group of bits and the at least one of the plurality of current sources is selected based on the column control signal. The scrambling column decoder module includes a B/T scrambling column decoder module.

In other features, the scrambling row decoder module includes a previous row scrambling module that generates a previous row control signal of the pair of row control signals based on the row group of bits and a set of row pseudo-random sequences. The at least one of the plurality of current sources is selected when the previous row control signal is active. The scrambling row decoder module includes a present row scrambling module that generates a present row control signal of the pair of row control signals based on the row group of bits and the set of row pseudo-random sequences. The at least one of the plurality of current sources is selected when the present row control signal and the previous row control signal are active. The previous row scrambling module and the present row scrambling module respectively include a set of previous row sum modules and a set of present row sum modules and each of the set of previous row sum modules and the set of present row sum modules respectively generate a carry up output and a carry down output based on the row group of bits, the set of row pseudo-random sequences, and a respective carry input.

In other features, the previous row scrambling module receives a first carry input and the present row scrambling module receives a second carry input. Each of the previous row sum modules respectively correspond to each of the present row sum modules to form pairs of sum modules. Each of the pairs of sum modules respectively receives one of the row group of bits and one of the set of row pseudo-random sequences.

In other features, each of the previous row sum modules and each of the present row sum modules respectively outputs the one of the row group of bits at the carry up output and outputs the respective carry input at the carry down output when one of the set of row pseudo-random sequences equals zero. Each of the previous row sum modules and each of the present row sum modules respectively outputs the one of the row group of bits at the carry down output and outputs the respective carry input at the carry up output when one of the set of row pseudo-random sequences equals one.

A scrambling system for a DAC includes digital-to-analog conversion means for receiving a digital input word and scrambling means for randomly selecting at least one of a plurality of current sources based on the digital input word. The digital-to-analog conversion means outputs an analog signal based on the at least one of the plurality of current sources.

In other features, the scrambling means includes scrambling row decoder means for decoding and scrambling a row group of bits of the digital input word. The scrambling row decoder means generates a pair of row control signals based on the scrambled row group of bits and the at least one of the plurality of current sources is selected based on the pair of row control signals. The scrambling row decoder means includes binary-thermometer (B/T) scrambling row decoder means.

In other features, the scrambling means includes scrambling column decoder means for decoding and scrambling a column group of bits of the digital input word. The scrambling column decoder means generates a column control signal based on the scrambled column group of bits and the at least one of the plurality of current sources is selected based on the column control signal. The scrambling column decoder means includes B/T scrambling column decoder means.

In other features, the scrambling row decoder means includes previous row scrambling means for generating a previous row control signal of the pair of row control signals based on the row group of bits and a set of row pseudo-random sequences. The at least one of the plurality of current sources is selected when the previous row control signal is active. The scrambling row decoder means includes present row scrambling means for generating a present row control signal of the pair of row control signals based on the row group of bits and the set of row pseudo-random sequences. The at least one of the plurality of current sources is selected when the present row control signal and the previous row control signal are active. The previous row scrambling means and the present row scrambling means respectively include a set of previous row sum means and a set of present row sum means and each of the set of previous row sum means and the set of present row sum means respectively generate a carry up output and a carry down output based on the row group of bits, the set of row pseudo-random sequences, and a respective carry input.

In other features, the previous row scrambling means receives a first carry input and the present row scrambling means receives a second carry input. Each of the previous row sum means respectively correspond to each of the present row sum means to form pairs of sum means. Each of the pairs of sum means respectively receives one of the row group of bits and one of the set of row pseudo-random sequences.

In other features, each of the previous row sum means and each of the present row sum means respectively outputs the one of the row group of bits at the carry up output and outputs the respective carry input at the carry down output when one of the set of row pseudo-random sequences equals zero. Each of the previous row sum means and each of the present row sum means respectively outputs the one of the row group of bits at the carry down output and outputs the respective carry input at the carry up output when one of the set of row pseudo-random sequences equals one.

A scrambling method for a DAC includes receiving a digital input word, randomly selecting at least one of a plurality of current sources based on the digital input word, and outputting an analog signal based on the at least one of the plurality of current sources.

In other features, the method further comprises decoding and scrambling a row group of bits of the digital input word. The method further comprises generating a pair of row control signals based on the scrambled row group of bits and the at least one of the plurality of current sources is selected based on the pair of row control signals. The method further comprises decoding and scrambling a column group of bits of the digital input word. The method further comprises generating a column control signal based on the scrambled column group of bits and the at least one of the plurality of current sources is selected based on the column control signal.

In other features, the method further comprises generating a previous row control signal of the pair of row control signals based on the row group of bits and a set of row pseudo-random sequences. The at least one of the plurality of current sources is selected when the previous row control signal is active. The method further comprises generating a present row control signal of the pair of row control signals based on the row group of bits and the set of row pseudo-random sequences. The at least one of the plurality of current sources is selected when the present row control signal and the previous row control signal are active. The method further comprises generating a carry up output and a carry down output based on the row group of bits, the set of row pseudo-random sequences, and a respective carry input.

In other features, the method further comprises receiving a first carry input and receiving a second carry input. Each of the pairs of sum modules respectively receives one of the row group of bits and one of the set of row pseudo-random sequences. Each of the previous row sum modules and each of the present row sum modules respectively outputs the one of the row group of bits at the carry up output and outputs the respective carry input at the carry down output when one of the set of row pseudo-random sequences equals zero. Each of the previous row sum modules and each of the present row sum modules respectively outputs the one of the row group of bits at the carry down output and outputs the respective carry input at the carry up output when one of the set of row pseudo-random sequences equals one.

A computer program stored for use by a processor for operating a DAC includes receiving a digital input word, randomly selecting at least one of a plurality of current sources based on the digital input word, and outputting an analog signal based on the at least one of the plurality of current sources.

In other features, the program further comprises decoding and scrambling a row group of bits of the digital input word. The program further comprises generating a pair of row control signals based on the scrambled row group of bits and the at least one of the plurality of current sources is selected based on the pair of row control signals. The program further comprises decoding and scrambling a column group of bits of the digital input word. The program further comprises generating a column control signal based on the scrambled column group of bits and the at least one of the plurality of current sources is selected based on the column control signal.

In other features, the program further comprises generating a previous row control signal of the pair of row control signals based on the row group of bits and a set of row pseudo-random sequences. The at least one of the plurality of current sources is selected when the previous row control signal is active. The program further comprises generating a present row control signal of the pair of row control signals based on the row group of bits and the set of row pseudo-random sequences. The at least one of the plurality of current sources is selected when the present row control signal and the previous row control signal are active. The program further comprises generating a carry up output and a carry down output based on the row group of bits, the set of row pseudo-random sequences, and a respective carry input.

In other features, the program further comprises receiving a first carry input and receiving a second carry input. Each of the pairs of sum modules respectively receives one of the row group of bits and one of the set of row pseudo-random sequences. Each of the previous row sum modules and each of the present row sum modules respectively outputs the one of the row group of bits at the carry up output and outputs the respective carry input at the carry down output when one of the set of row pseudo-random sequences equals zero. Each of the previous row sum modules and each of the present row sum modules respectively outputs the one of the row group of bits at the carry down output and outputs the respective carry input at the carry up output when one of the set of row pseudo-random sequences equals one.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
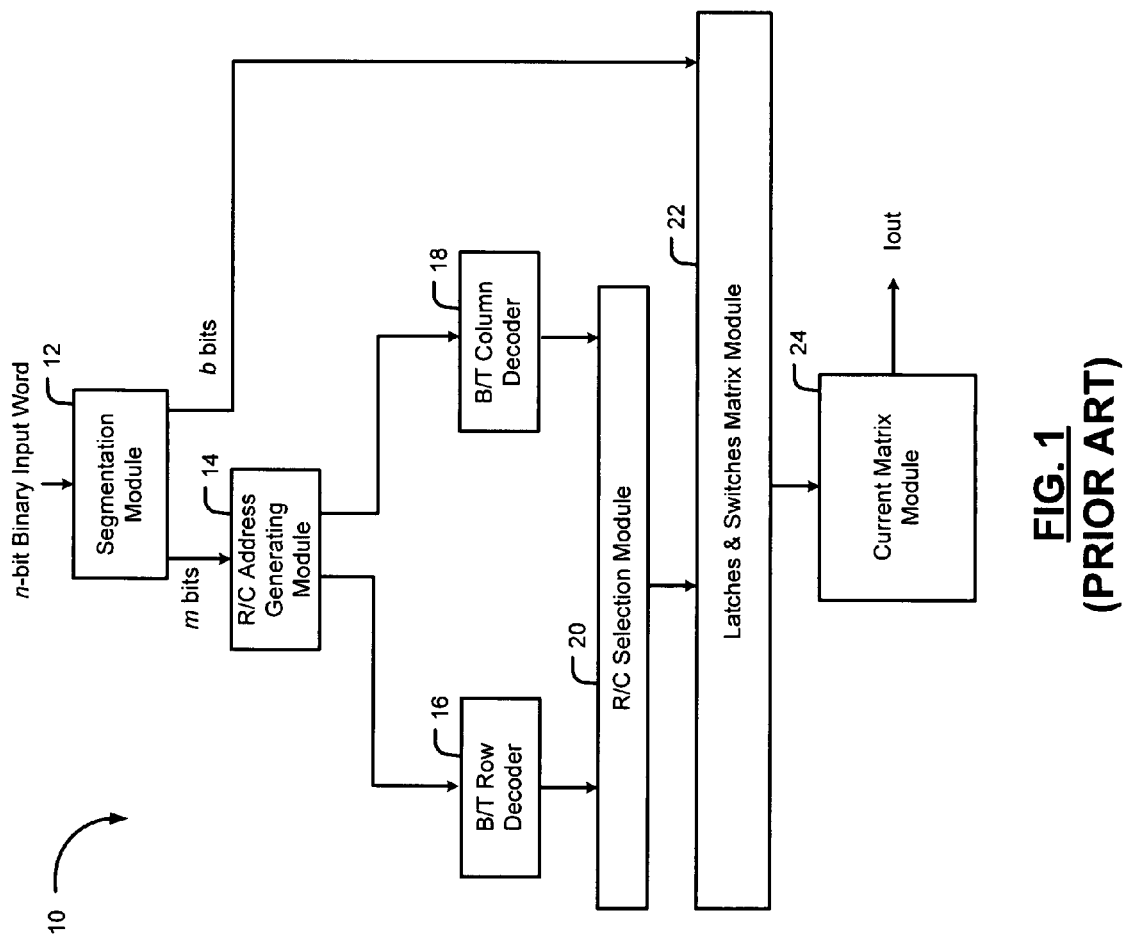
FIG. 1 is a is a functional block diagram of an exemplary digital-to-analog converter (DAC) according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Conventional unary current-steering digital-to-analog converters (DACs) typically operate monotonically such that if a value of a binary input word increase linearly, the DAC activates additional current sources while maintaining previously active current sources to generate an output current (Iout) corresponding to the binary input word.

Figure 3:
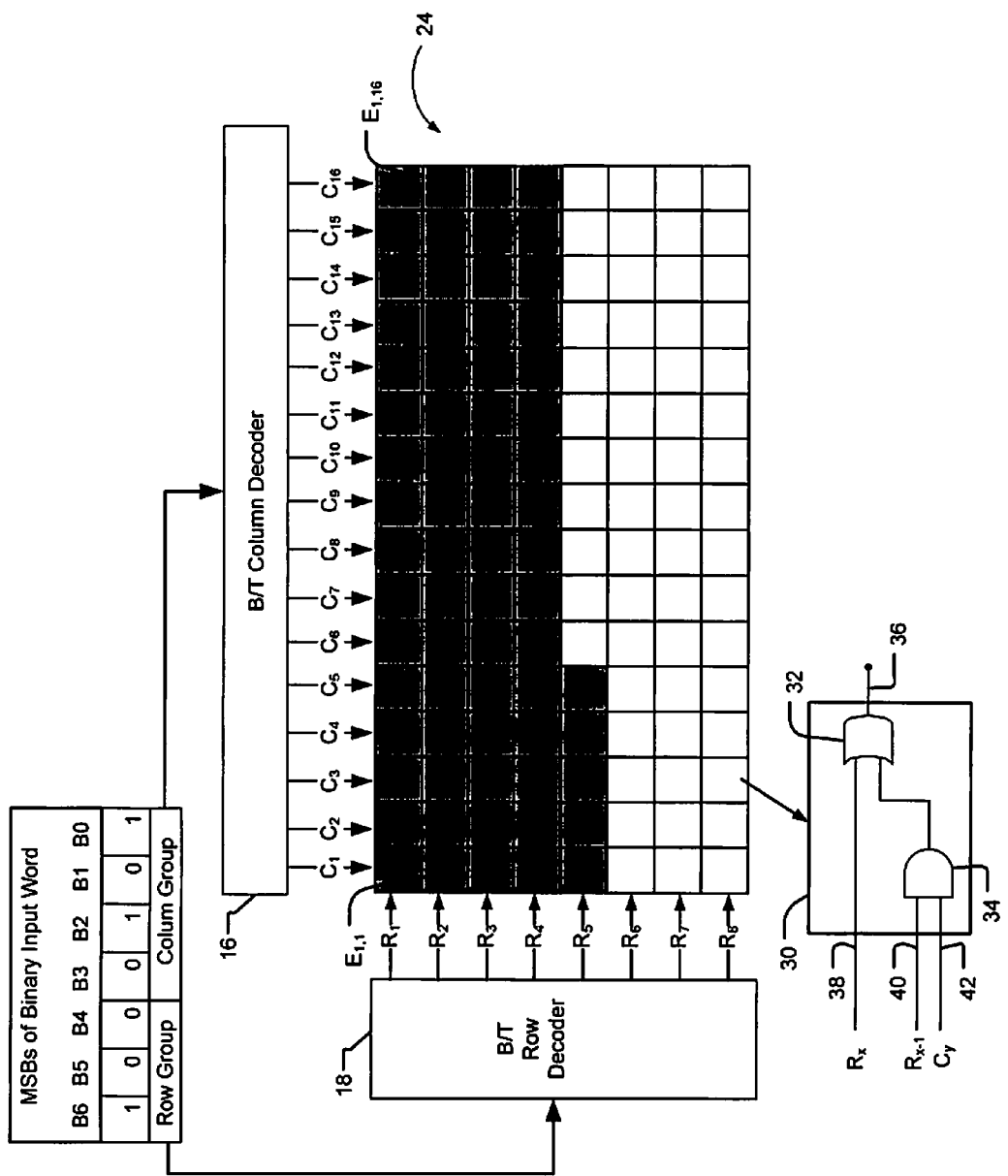
FIG. 3 illustrates the operation of a binary-thermometer (BIT) row decoder and a B/T column decoder of the exemplary DAC according to the prior art.

FIG. 3 illustrates the operation of the binary-thermometer (B/T) row decoder 16 and the B/T column decoder 18 according to the prior art. Typically, a high resolution (i.e. >10 bit) current-steering DAC is divided into groups where each group converts a portion of a binary input signal to a corresponding analog output signal. In the present implementation, a segmented current-current steering DAC architecture is used in which an exemplary 7-bit group of most significant bits (MSBs) of a 14-bit exemplary binary input word is illustrated. In the segmented current-steering DAC, the MSB group is expressed by a matrix of unary, or unweighted, current sources that are controlled by thermometer coded signals. In the present implementation, the MSB group is further partitioned into a column group including bits B0, B1, B2, and B3 corresponding to values $2^0$, $2^1$, $2^2$, and $2^3$, respectively, and a row group including bits B4, B5, and B6, corresponding to values $2^4$, $2^5$, and $2^6$.

Figure 2:
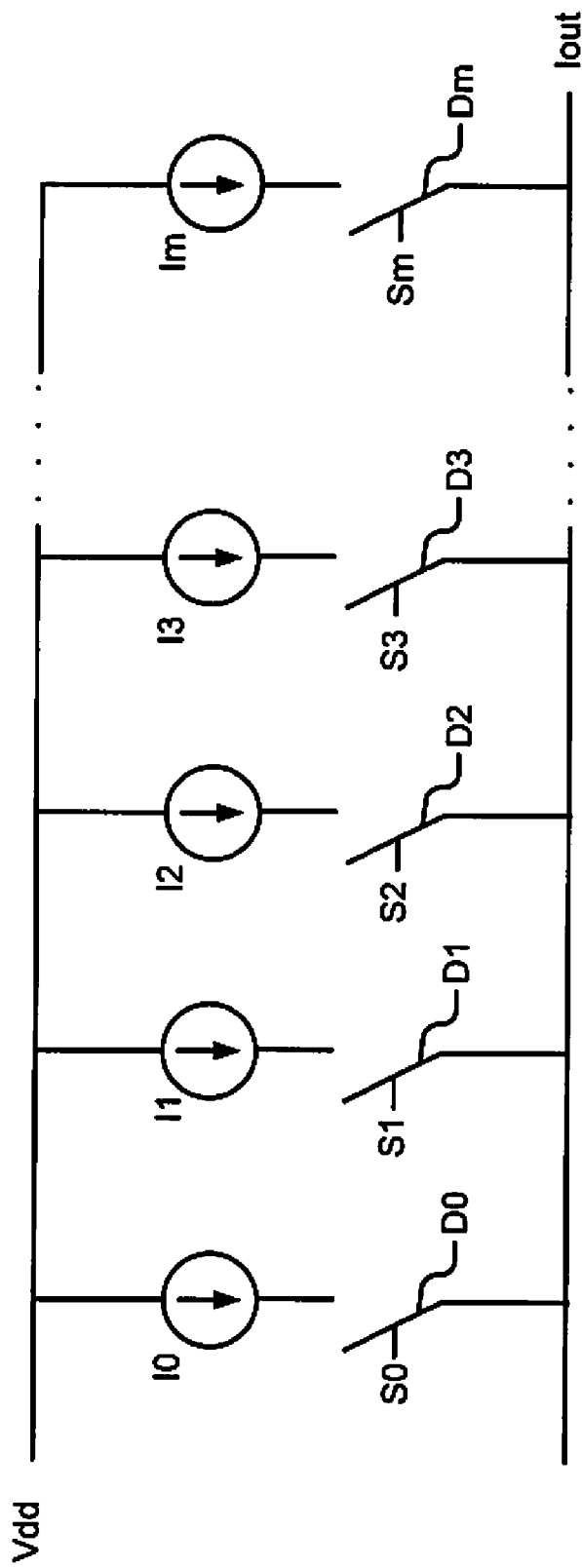
FIG. 2 illustrates a plurality of unary current sources of the exemplary DAC according to the prior art.

The current matrix module 24 includes a set of elements, referred to specifically as Er, c, organized into rows (e.g. 8) and columns (e.g. 16) where r indicates a row position of the element within the current matrix module 24 and c indicates the column position within the current matrix module 24. Although the present implementation of the current matrix module 24 includes 128 elements, the current matrix module 24 can be of variable size. Each element includes an associated current source (not shown) with a corresponding switch (not shown). An element having a shaded area indicates that the switch associated with the element is active (i.e. turned ON or set to "1"), and the associated current source provides current to an output current (Iout) of a DAC as depicted in FIG. 2.

The B/T column decoder 16 and the B/T row decoder 18 generate control signals that selectively activate various elements based on the MSBs of the binary input word. The B/T column decoder 16 decodes the column group of bits of the MSBs, and the B/T row decoder 18 decodes the row group of bits of the MSBs. Typically, the elements of the current matrix module 24 are activated sequentially beginning from Row 1 (i.e. $R_1$) and progressing across the columns in sequential order (e.g. $E_{1,1}$, $E_{1,2}$, $E_{1,3}$, . . . , etc) and continuing for each following row of the current matrix module 24 as necessary based on the MSBs. In the present example, the MSBs of "1000101" equates to a base-10 value of 69. As depicted by the current matrix module 24, the elements beginning with $E_{1,1}$ continuing sequentially to $E_{5,5}$ are activated.

Each element includes a R/C selector 30. The R/C selector 30 includes an OR gate 32 and an AND gate 34. In various embodiments, an element is activated based on the output signal 36 of the R/C selector 30 associated with the element. An element of the current matrix module 24 is activated based on a present row control signal 38 associated with the present row (i.e. $R_x$) of the element, a previous row control signal 40 associated with a previous row (i.e. $R_{x-1}$) with respect to the element, and a present column control signal 42 associated with a present column (i.e. $C_y$) of the element. For example, referring to $E_{5,5}$, the current row (i.e. row 5) is inactive (i.e. set to "0"), the previous row (i.e. row 4) is active (i.e. set to "1"), and the current column (i.e. column 5) is active. As a result, $E_{5,5}$ is active (i.e. set to "1"). In the present implementation, a nonexistent Row 0 (i.e. $R_0$) of the current matrix module 24 is set to "1" when determining whether the elements of Row 1 (i.e. $R_1$) are to be activated.

Statistical variations (e.g. threshold voltage variations and current mismatches) among parameters of the various switches of a current-steering DAC induce errors in the currents (i.e. unary, binary weighted, and/or segmented) used in current-steering DACs. These errors translate into degradation of the linear performance of the DAC. Typically, the performance of a DAC is specified through static parameters such as an Integral Non Linearity (INL) and a Differential Non Linearity (DNL) and dynamic parameters such as a Spurious Free Dynamic Range (SFDR). The present disclosure scrambles the error introduced by the statistical variations, thereby eliminating a correlation of the error with the output signal of the DAC that results in a decreased harmonic distortion within the output signal.

Figure 4:
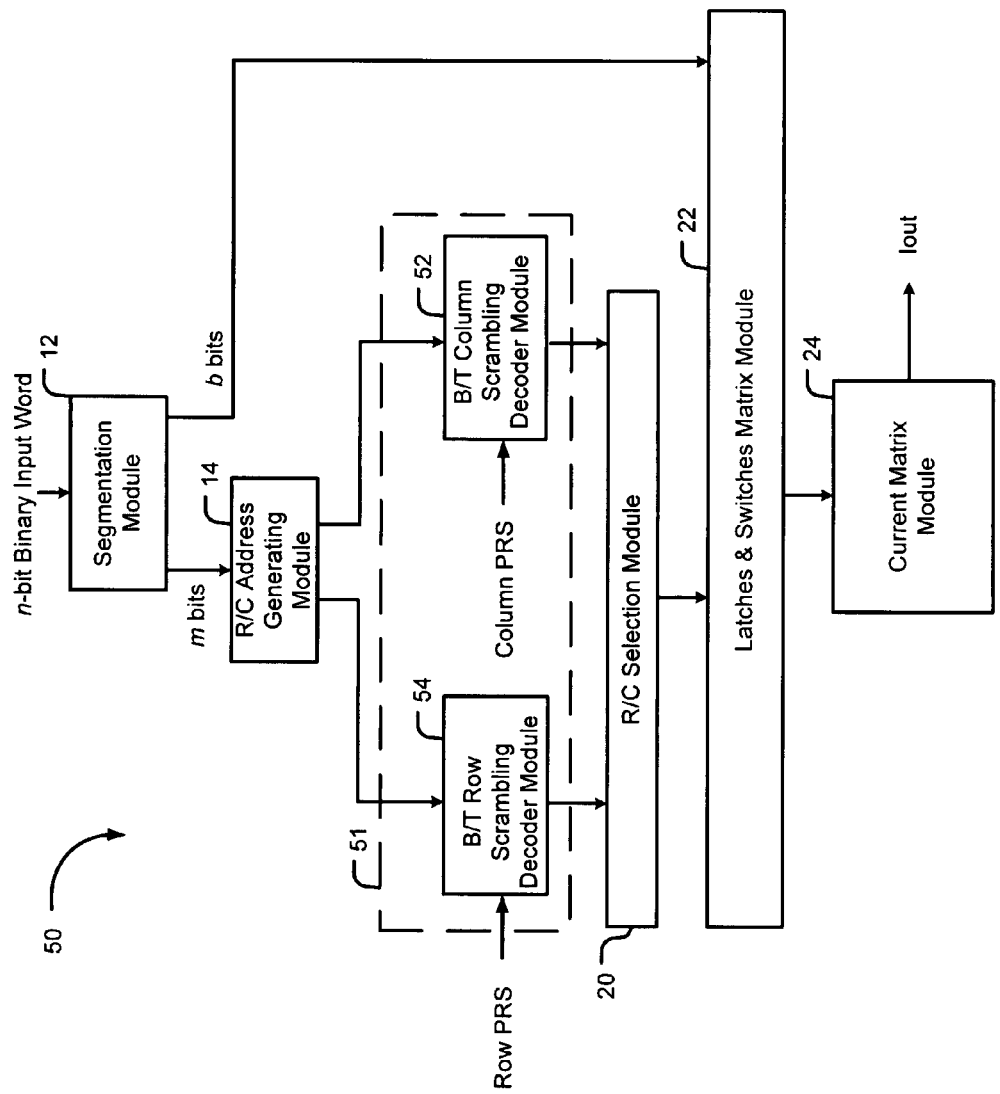
FIG. 4 is a functional block diagram of an exemplary DAC according to the present disclosure.

Referring now to FIG. 4, an exemplary current-steering DAC 50 according to the present disclosure is illustrated. The exemplary DAC 50 may implement a scrambling system by including a scrambling module 51. The scrambling module 51 includes an exemplary B/T column scrambling decoder module 52 and an exemplary B/T row scrambling decoder module 54.

The scrambling decoder modules 52 and 54 decode and randomly scramble a digital input word used to activate the switches of the latches and switches matrix module 22. The B/T column scrambling decoder module 52 and the B/T row scrambling decoder module 54 scramble the digital input word based on column and row pseudo-random sequences (PRS), respectively, that are generated by a PRS generator such as a linear feedback shift register (LFSR). In various embodiments, the scrambling decoder modules 52 and 54 may be implemented by the same integrated circuit and/or by additional integrated circuits.

Figure 5:
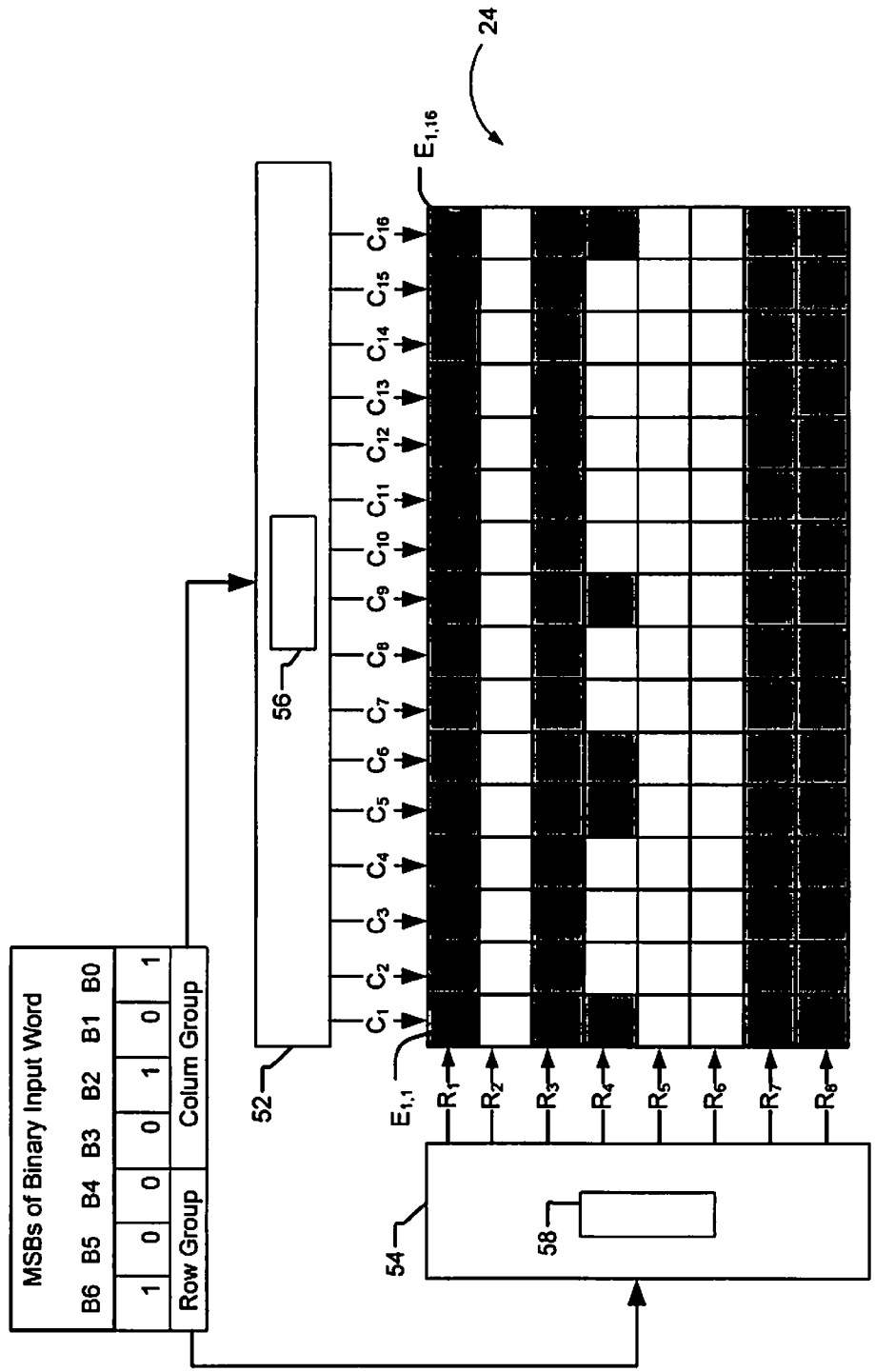
FIG. 5 illustrates the scrambling operation performed by a binary-thermometer (B/T) row scrambling decoder module and a B/T column scrambling decoder module of the exemplary DAC according to the present disclosure.

Referring now to FIG. 5, a scrambling operation performed by the scrambling decoder modules 52, 54 of the DAC 50 is illustrated. Although the present implementation includes the same exemplary 7-bit group of MSBs (i.e. 1000101) partitioned into a column group and row group as used in FIG. 3, other configurations are possible. The scrambling decoder modules 52 and 54 generate control signals based on the MSBs. It is noteworthy that other digital input words of variable size and value are anticipated, and the present disclosure is not limited to this exemplary embodiment. The B/T column scrambling decoder module 52 decodes the column group of bits of the MSBs and the B/T row scrambling decoder module 54 decodes the row group of bits of the MSBs. The B/T column scrambling decoder module 52 and the B/T row scrambling decoder module 54 maintain the integrity of the MSBs while randomly activating elements of the current matrix module 24 based on column and row PRSs, respectively. For example, each time the DAC 50 receives the same digital input word to be converted, different combinations of the elements of the current matrix module 24 are activated to generate the corresponding analog signal. Those skilled in the art can appreciate that various pseudo random sequences may be orthogonal to each other. In the present implementation, the 7-bit group of MSBs uses 22 orthogonal pseudo random sequences.

In other words, by randomly activating elements of the current matrix module 24, the scrambling decoder modules 52 and 54 eliminate the impact of errors associated with the current source of each element on an output signal of the DAC 50, thereby ensuring that an averaged performance of the DAC 50 is linear.

Figure 6:
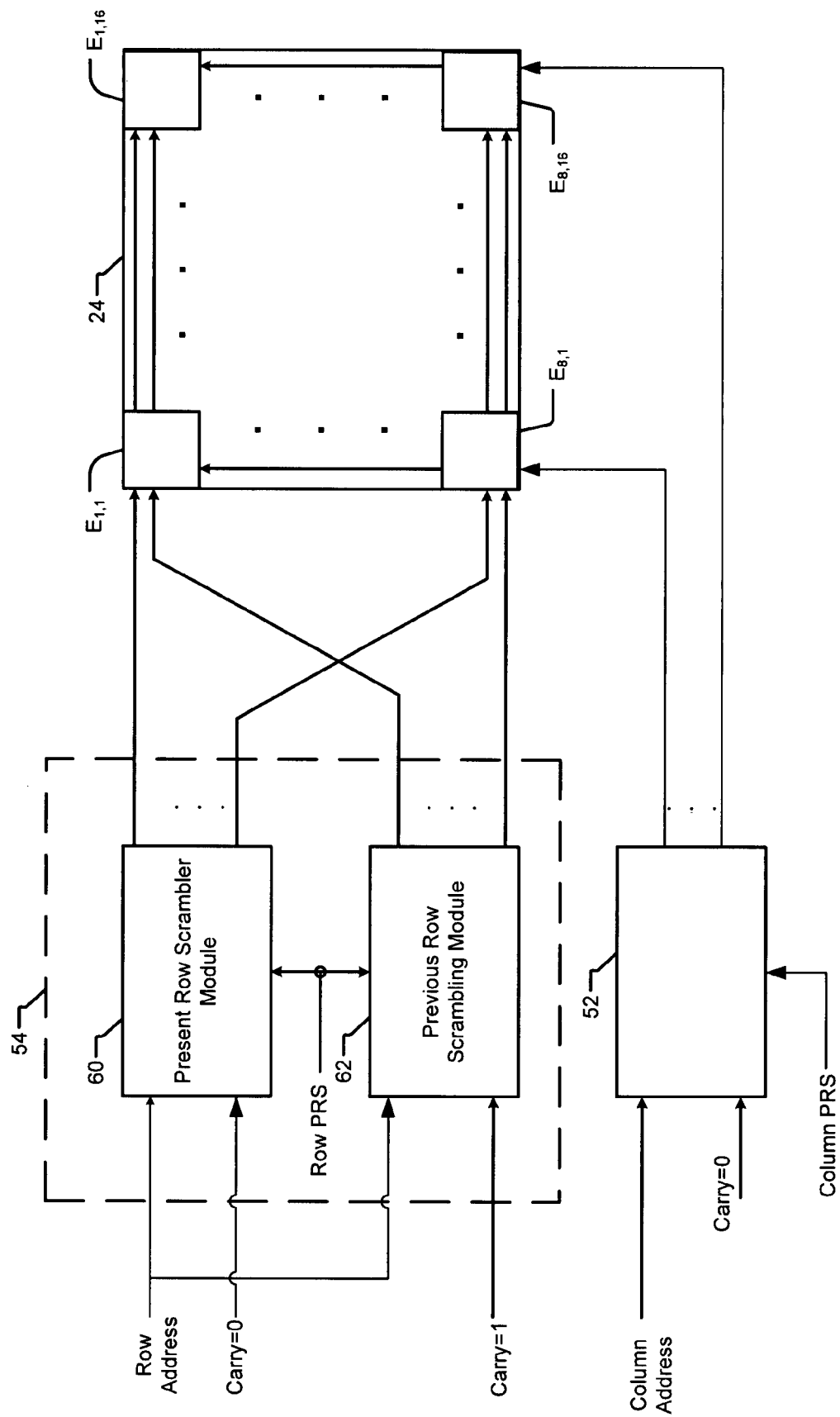
FIG. 6 further illustrates the scrambling operation performed by a present row scrambling module and a previous row scrambling module according to the present disclosure.

Referring now to FIG. 6, the operation of the B/T column scrambling decoder module 52 and the B/T row scrambling decoder module 54 is shown in more detail. The B/T row scrambling decoder module 54 is shown to include a present row scrambler module 60 and a previous row scrambling module 62. The present row scrambler module 60 and the previous row scrambling module 62 receive the row group of bits (e.g. "100") of the MSBs of the exemplary digital input word. Additionally, in the present implementation, the present row scrambling module 60 and the previous row scrambling module 62 receive an active carry input (i.e. set to "1") and an inactive carry input (i.e. set to "0"), respectively. The present row scrambling module 60 and previous row scrambling module 62 decode and scramble the row group of bits (i.e. B7, B6, and B5) and generate an active or inactive present row control signal and an active or inactive previous row control, respectively, for each element of the current matrix module 24 based on a set of row PRSs.

In the present implementation, the exemplary B/T column scrambling decoder module 54 receives the column group of bits (e.g. "0101") of the MSBs of the exemplary digital input word and various column PRSs. Additionally, in the present implementation, the B/T column scrambling decoder module 54 receives an inactive carry input. The B/T column scrambling decoder module 54 decodes and scrambles the column group of bits (i.e. B0, B1, B2, and B3) and generates an active or inactive present column control signal based on the column PRSs.

R/C selectors associated with each element of the current matrix module 24 respectively receive a present row control signal, a previous row control signal, and a present column control signal associated with each element of the current matrix module 24. As discussed with respect to FIG. 3, an element is activated based on the output signal of an associated R/C selector. In the present implementation, each R/C selector receives a present row control signal and a previous row control signal that form a "couple". An active couple (i.e. active present row control signal and active previous row control signal) indicates that the elements of the present row are all set active. A partially active couple (i.e. active previous control signal and inactive current control signal) indicates that various elements of the present row are activated. An inactive couple (i.e. active previous row control signal and inactive present row control signal) indicates that elements of the present row are all inactive.

Figure 7A:
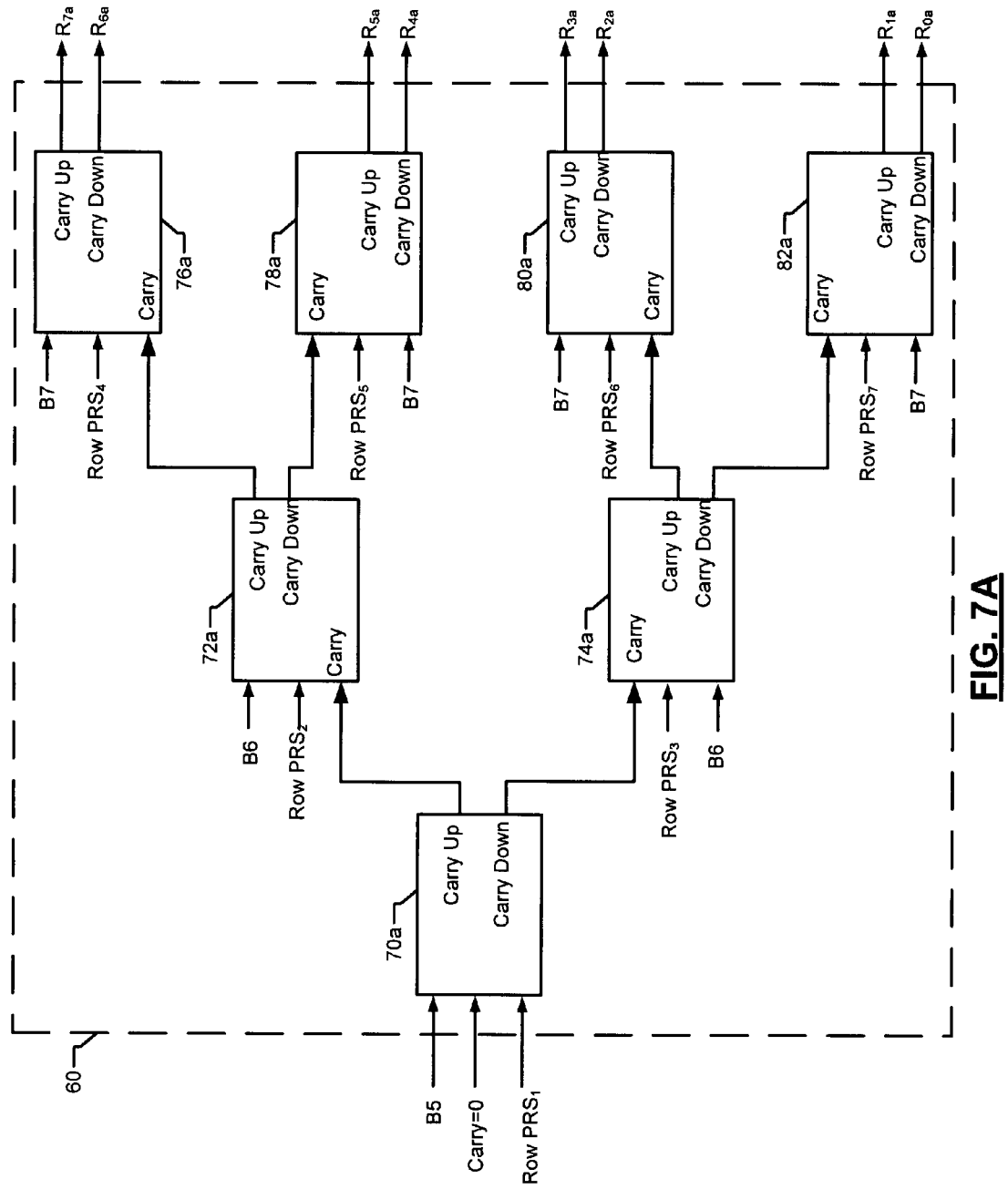
FIG. 7A is a functional block diagram of an exemplary present row scrambling module according to the present disclosure.
Figure 7B:
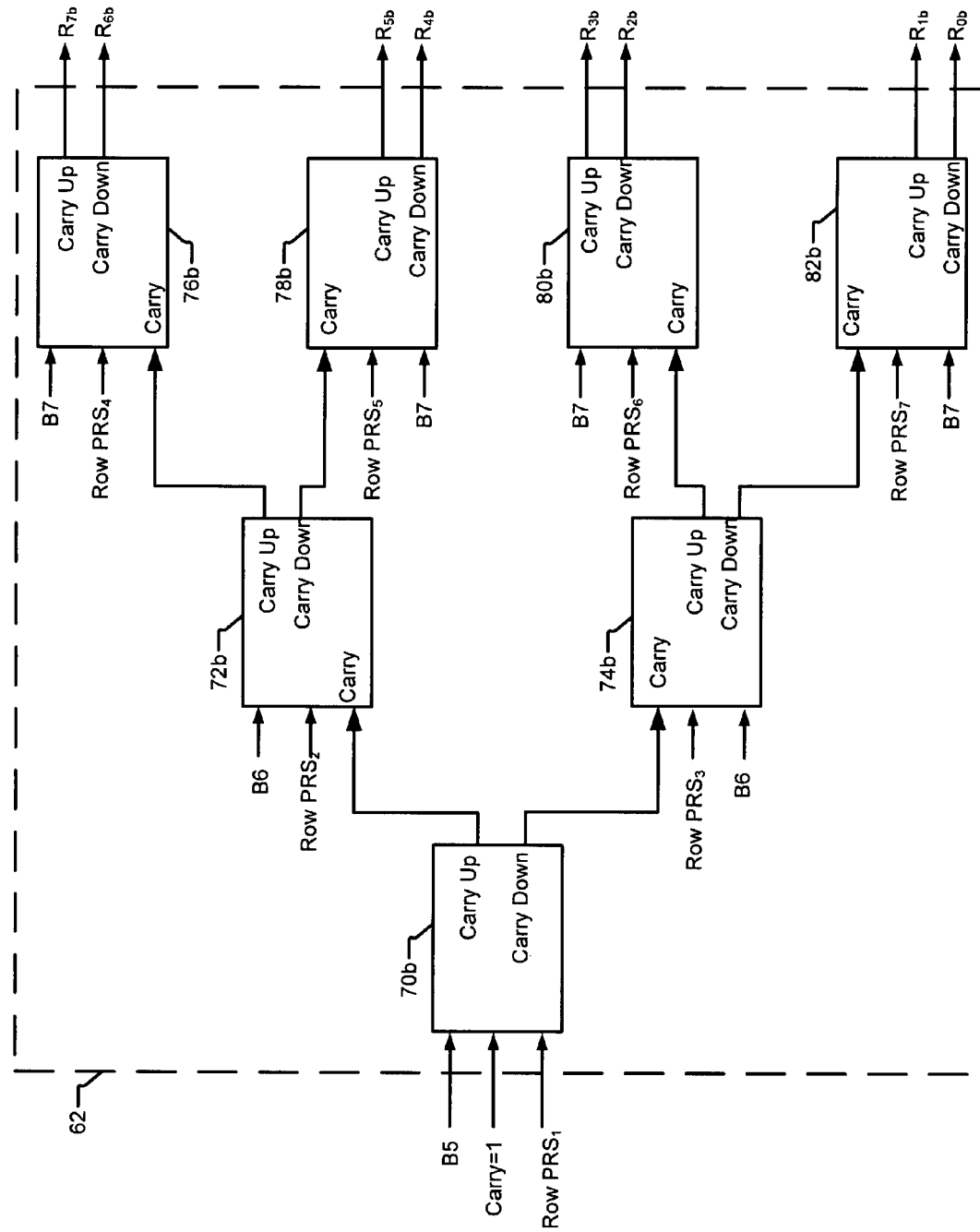
FIG. 7B is a functional block diagram of an exemplary previous row scrambling module according to the present disclosure.

Referring now to FIGS. 7A and 7B, the present row scrambling module 60 and the previous row scrambling module 62, respectively, are shown performing a scrambling operation of the row group of MSBs of the digital input word. Although a scrambling operation of the row group of MSBs is illustrated, those skilled in the art can appreciate that a scrambling operation of the column group of bits may function similarly to the row scrambling operation described herein. The present row scrambling module 60 includes sum modules 70a, 72a, 74a, 76a, 78a, and 80a, referred to collectively as the present row sum modules. The previous row scrambling module 62 includes sum modules 70b, 72b, 74b, 76b, 78b, and 80b, referred to collectively as the previous row sum modules. The sum modules 70a, 72a, 74a, 76a, 78a, and 80a are associated with the sum modules 70b, 72b, 74b, 76b, 78b, and 80b, respectively. In the present implementation, the present row sum modules and the previous row sum modules function in identical fashion.

Each present and previous row sum module generates carry up and carry down outputs based on the row group of bits, a row PRS, and a carry input. Each of the present and previous row sum modules receives a single bit of the row group of bits as a binary input. In the present implementation, the sum module 70a receives the least significant bit (i.e. B5) of the row group of bits, the sum modules 72a and 74a receive the second most significant bit (i.e. B6), and the sum modules 76a, 78a, 80a, and 80b receive the most significant bit (i.e. B7) of the row group of bits. Additionally, each of the present and previous row sum modules receives a row PRS. Each row PRS of the scrambling module 60 are generated independently. Each of the present and previous sum modules determines whether to output the binary input or carry input at the carry up or carry down output based on a row PRS. For example, each of the present and previous row sum modules outputs a respective binary input at the carry up output and a respective carry input at the carry down output when the respective sum module receives a row PRS equal to "0". In contrast, each of the present and previous row sum modules outputs the binary input at the carry down output and the carry input at the carry up output when the respective sum module receives a row PRS equal to "1".

In various embodiments, each associated pair of sum modules of present and previous row scrambling modules 60, 62 receive the same binary input and row PRS thereby maintaining data integrity after a scrambling operation. For example, the sum modules 70a and 70b receive B5 as a binary input and a row $PRS_1$, the sum module 74a and 74b receive B6 and a row $PRS_3$, and the sum module 82a and 82b receive B7 and a row $PRS_3$. Additionally, as discussed in FIG. 6, the sum module 70a and the sum module 70b receive an inactive carry input (i.e. set to "0") and an active carry input (i.e. set to "1"), respectively.

Combinations of the present row signals generated at the outputs of sum modules 76a, 78a, 80a, and 82a with the respective previous row signals generated at the outputs of the sum modules 76b, 78b, 80b, and 82b form a plurality of couples transmitted to the R/C selectors. For example, a row 7 control signal ($R_{7a}$) output by the sum module 76a is coupled with a row 7 control signal ($R_{7b}$) output by the sum module 76b to form an exemplary couple. The present implementation includes, but is not limited to, 8 couples formed by the outputs of the present row scrambling module 60 and the previous row scrambling module 62. In other words, the present and previous row scrambling modules 60 and 62 and the B/T column scrambling decoder module 52 operate in combination to generate a scrambled thermometer code corresponding to the row and column group of bits.

Figure 8:
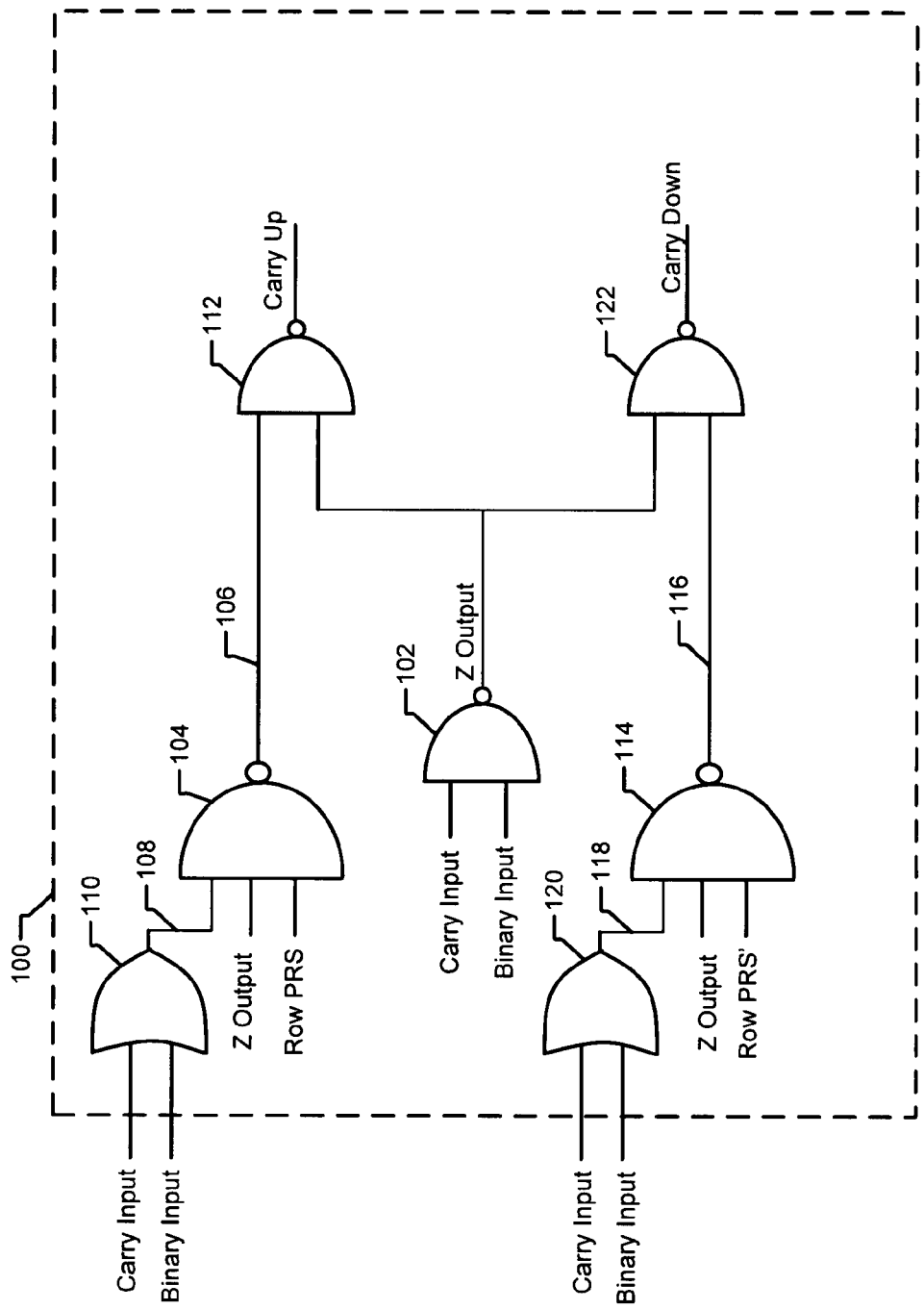
FIG. 8 is a functional block diagram of a sum module according to the present disclosure.

Referring now to FIG. 8, an exemplary sum module 100 is shown in more detail. As noted previously, each of the present and previous row sum modules operate identically, therefore the exemplary sum module 100 illustrates the operation of the present and previous row sum modules depicted in FIGS. 7A and 7B. The exemplary sum module 100 is shown to include a plurality of logic components. Those skilled in the art can appreciate that various other implementations of the exemplary sum module 100 are contemplated.

A logic module 102 (e.g. a NAND gate) generates an output signal (Z output) based on a carry input and a binary input. A logic module 104 (e.g. NAND gate) generates an output signal 106 based on an output signal 108 of the logic module 110, the Z output, and a row PRS. The logic module 110 (e.g. OR gate) generates the output signal 108 based on the carry input and the binary input. A logic module 112 (e.g. NAND gate) generates a carry up signal based on the output signal 106 and the Z output.

A logic module 114 (e.g. NAND gate) generates an output signal 116 based on an output signal 118 of the logic module 120, the Z output, and an inverted row PRS (row PRS'). The logic module 120 (e.g. OR gate) generates the output signal 118 based on the carry input and the binary input. A logic module 122 (e.g. NAND gate) generates a carry down signal based on the output signal 116 and the Z output.

Figure 9A:
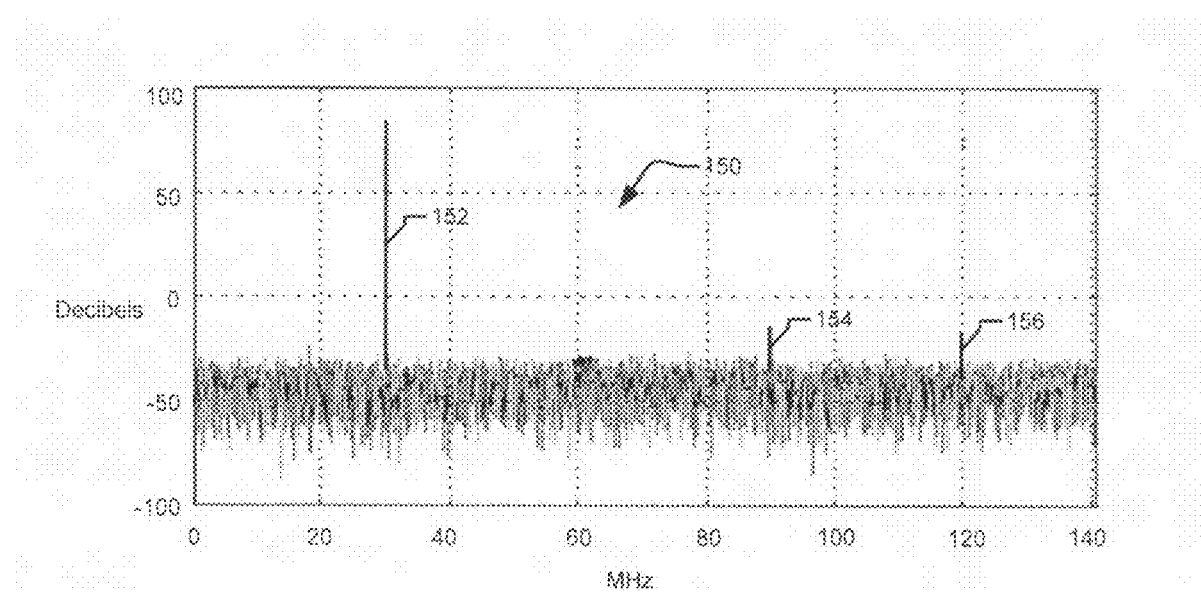
FIG. 9A is a graph illustrating an output spectrum of the conventional DAC according to the prior art.
Figure 9B:
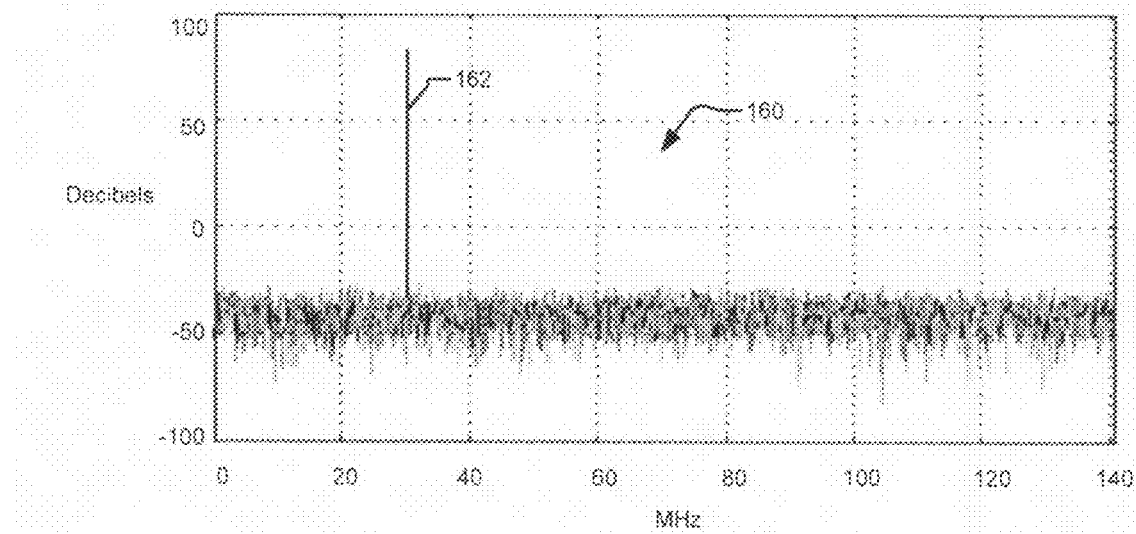
FIG. 9B is a graph illustrating an output spectrum of the exemplary DAC according to the present disclosure.

Referring now to FIGS. 9A and 9B, simulation results are shown for output spectrums of the conventional DAC 10 according to the prior art and the exemplary DAC 50 according to the present disclosure, respectively. FIG. 9A illustrates an output spectrum 150 that includes an output signal 152, and harmonics (i.e. "spurs") 154 and 156. FIG. 9B illustrates an output spectrum 160 of the exemplary DAC 50 that includes an output signal 162. The output spectrum of the exemplary DAC 50 includes only negligible harmonics (not shown) and lacks the spurious harmonics 154 and 156 depicted in FIG. 9A.

Figure 10:
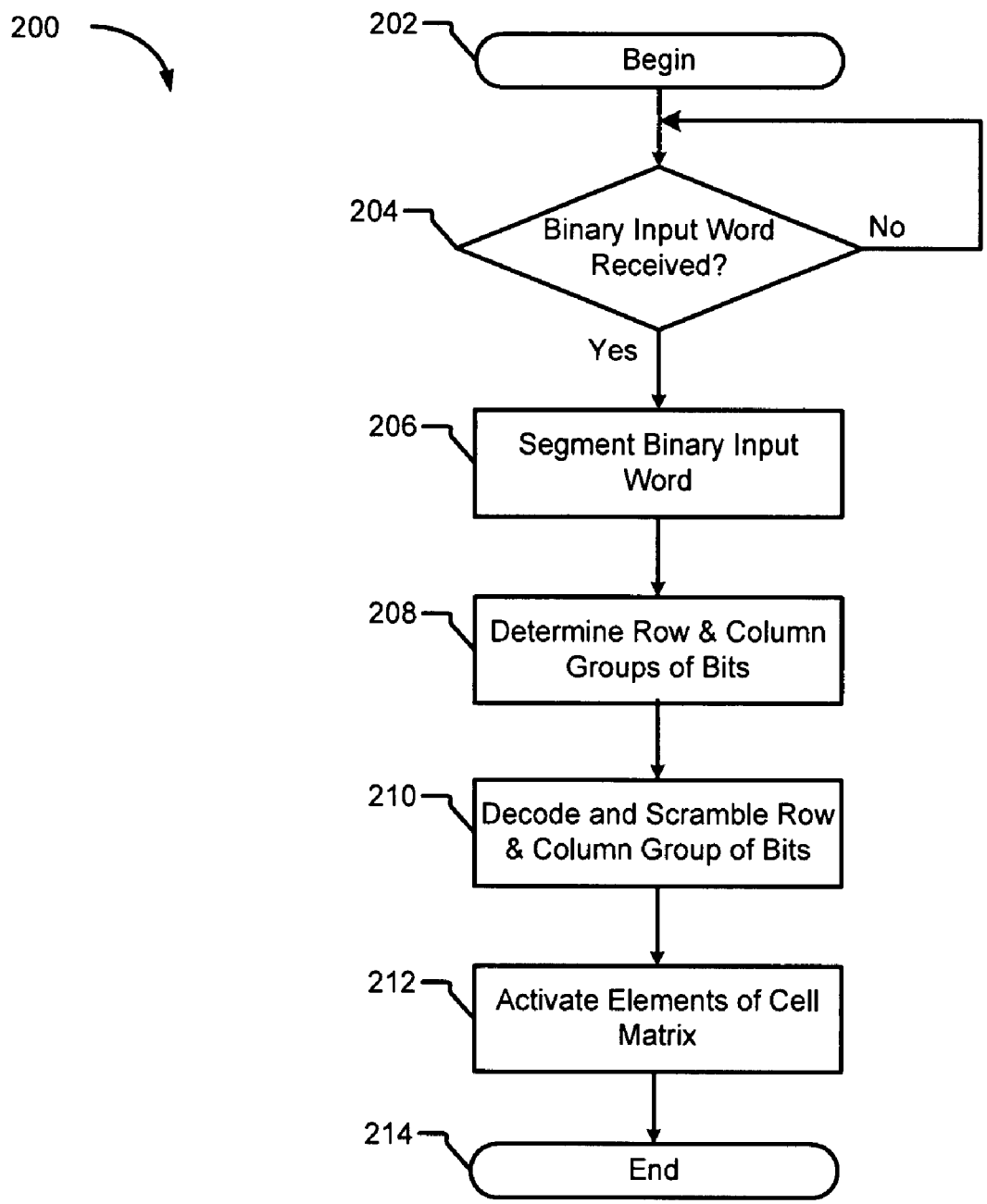
FIG. 10 is a flow diagram illustrating steps of a method for operating the scrambling system of the present disclosure.

Referring now to FIG. 10, a method 200 of performing a scrambling operation of the MSBs of a binary input word by the exemplary DAC 50 is shown in more detail. The method 200 begins in step 202. In step 204, the DAC 50 determines whether a digital input word has been received. If the DAC has not received a digital input word, the method 200 returns to step 204. If the DAC 50 receives a digital input word, the method 200 proceeds to step 206. In step 206, the DAC 50 divides the digital input word into a set of LSBs and MSBs. In step 208, the DAC generates row and column groups of bits based on the MSBs. In step 210, the DAC 50 generates a scrambled thermometer code based on a set of row and column PRSs that operate on the row and column group of bits, respectively. In step 212, the DAC 50 activates various elements of the current matrix module 24 based on the scrambled thermometer code. In step 214, the method 200 ends.

Figure 11A:
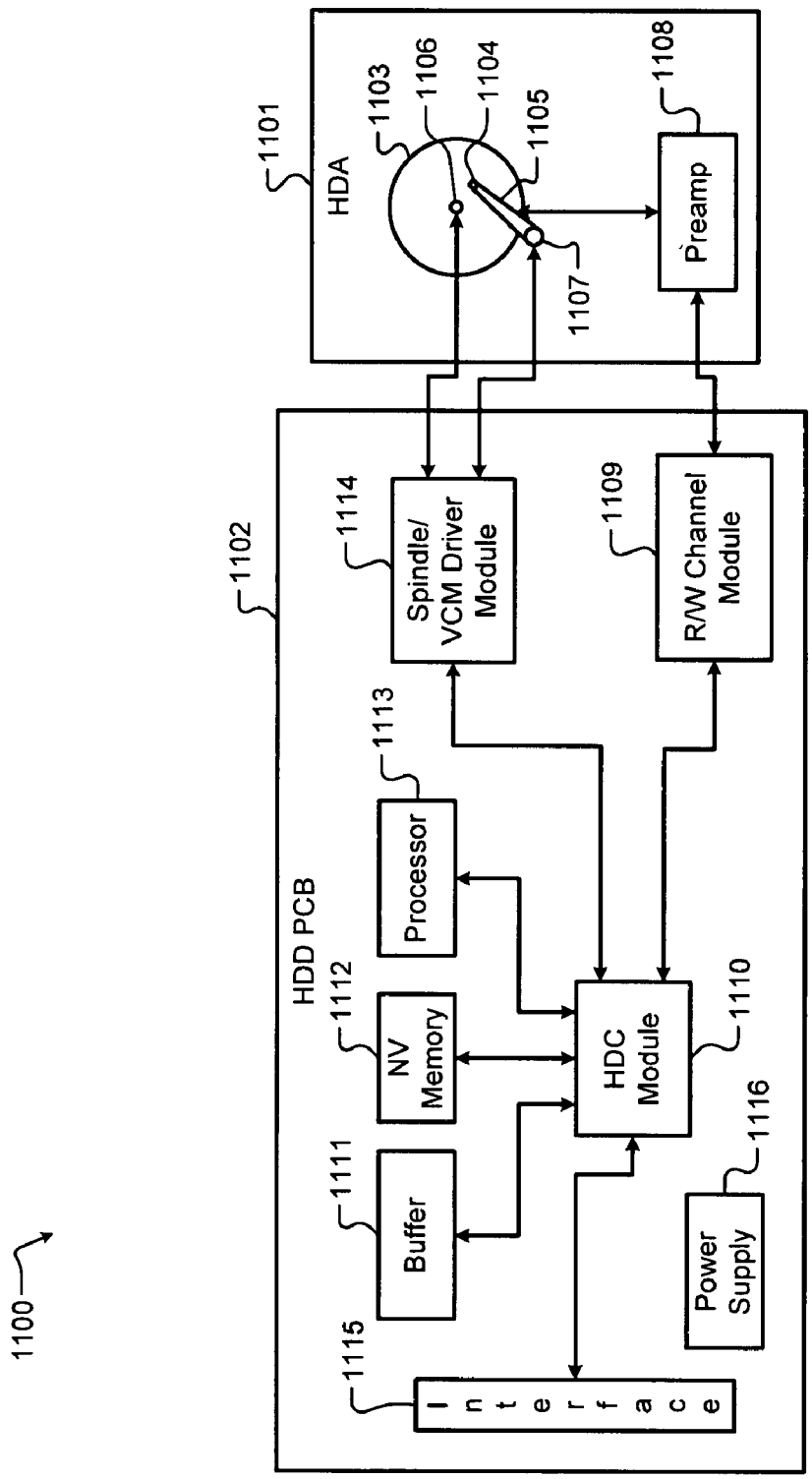
FIG. 11A is a functional block diagram of a hard disk drive.

Referring now to FIGS. 11A-11G, various exemplary implementations incorporating the teachings of the present disclosure are shown. Referring now to FIG. 11A, the teachings of the disclosure can be implemented in a DAC of a read/write channel module (hereinafter, "read channel") 1109 of a hard disk drive (HDD) 1100. The HDD 1100 includes a hard disk assembly (HDA) 1101 and a HDD PCB 1102. The HDA 1101 may include a magnetic medium 1103, such as one or more platters that store data, and a read/write device 1104. The read/write device 1104 may be arranged on an actuator arm 1105 and may read and write data on the magnetic medium 1103. Additionally, the HDA 1101 includes a spindle motor 1106 that rotates the magnetic medium 1103 and a voice-coil motor (VCM) 1107 that actuates the actuator arm 1105. A preamplifier device 1108 amplifies signals generated by the read/write device 1104 during read operations and provides signals to the read/write device 1104 during write operations.

The HDD PCB 1102 includes the read channel 1109, a hard disk controller (HDC) module 1110, a buffer 1111, nonvolatile memory 1112, a processor 1113, and a spindle/VCM driver module 1114. The read channel 1109 processes data received from and transmitted to the preamplifier device 1108. The HDC module 1110 controls components of the HDA 1101 and communicates with an external device (not shown) via an I/O interface 1115. The external device may include a computer, a multimedia device, a mobile computing device, etc. The I/O interface 1115 may include wireline and/or wireless communication links.

The HDC module 1110 may receive data from the HDA 1101, the read channel 1109, the buffer 1111, nonvolatile memory 1112, the processor 1113, the spindle/VCM driver module 1114, and/or the I/O interface 1115. The processor 1113 may process the data, including encoding, decoding, filtering, and/or formatting. The processed data may be output to the HDA 1101, the read channel 1109, the buffer 1111, nonvolatile memory 1112, the processor 1113, the spindle/VCM driver module 1114, and/or the I/O interface 1115.

The HDC module 1110 may use the buffer 1111 and/or nonvolatile memory 1112 to store data related to the control and operation of the HDD 1100. The buffer 1111 may include DRAM, SDRAM, etc. The nonvolatile memory 1112 may include flash memory (including NAND and NOR flash memory), phase change memory, magnetic RAM, or multi-state memory, in which each memory cell has more than two states. The spindle/VCM driver module 1114 controls the spindle motor 1106 and the VCM 1107. The HDD PCB 1102 includes a power supply 1116 that provides power to the components of the HDD 1100.

Figure 11B:
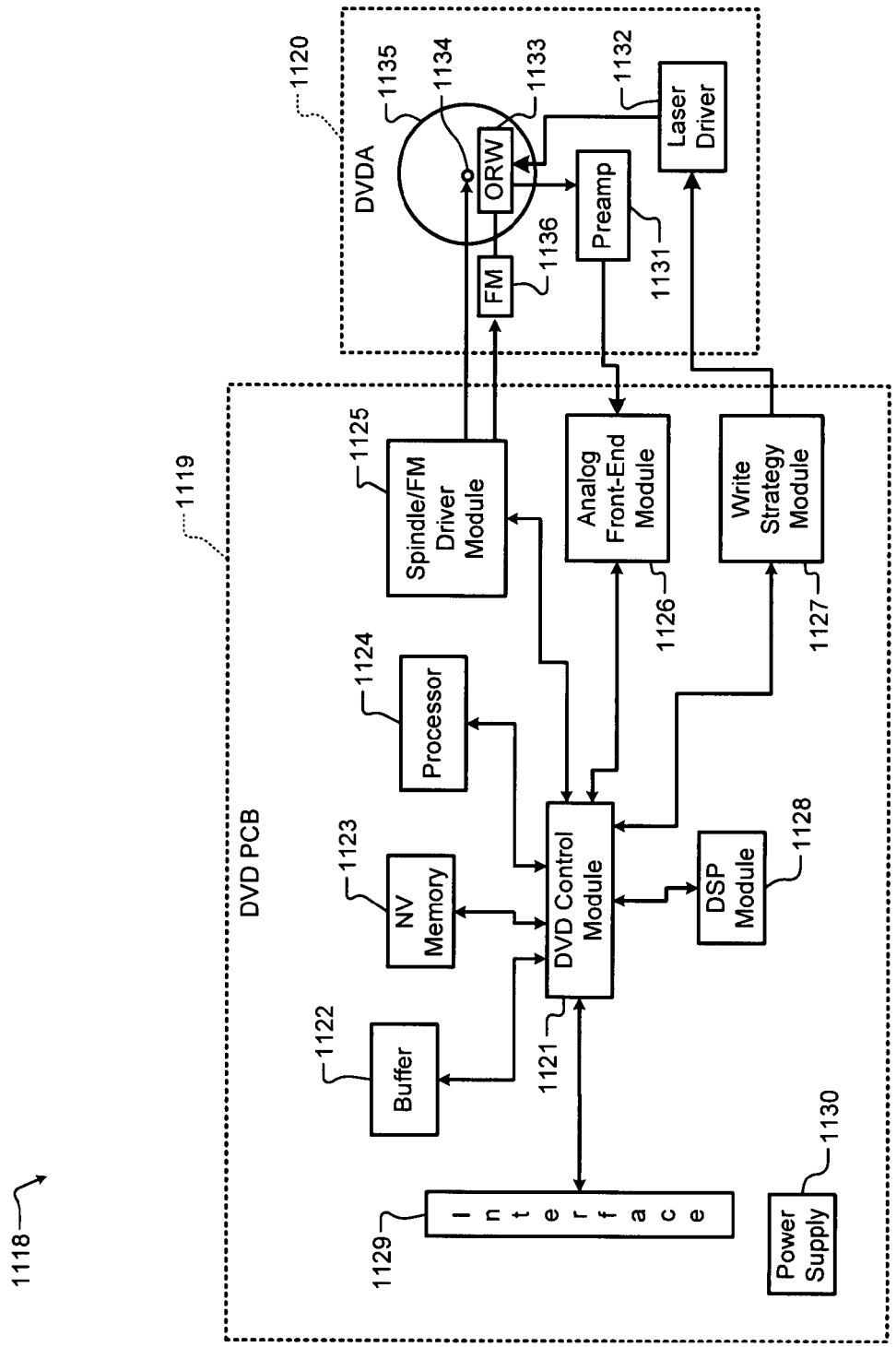
FIG. 11B is a functional block diagram of a DVD drive.

Referring now to FIG. 11B, the teachings of the disclosure can be implemented in a DAC of an analog front-end module 1126 of a DVD drive 1118 or of a CD drive (not shown). The DVD drive 1118 includes a DVD PCB 1119 and a DVD assembly (DVDA) 1120. The DVD PCB 1119 includes a DVD control module 1121, a buffer 1122, nonvolatile memory 1123, a processor 1124, a spindle/FM (feed motor) driver module 1125, an analog front-end module 1126, a write strategy module 1127, and a DSP module 1128.

The DVD control module 1121 controls components of the DVDA 1120 and communicates with an external device (not shown) via an I/O interface 1129. The external device may include a computer, a multimedia device, a mobile computing device, etc. The I/O interface 1129 may include wireline and/or wireless communication links.

The DVD control module 1121 may receive data from the buffer 1122, nonvolatile memory 1123, the processor 1124, the spindle/FM driver module 1125, the analog front-end module 1126, the write strategy module 1127, the DSP module 1128, and/or the I/O interface 1129. The processor 1124 may process the data, including encoding, decoding, filtering, and/or formatting. The DSP module 1128 performs signal processing, such as video and/or audio coding/decoding. The processed data may be output to the buffer 1122, nonvolatile memory 1123, the processor 1124, the spindle/FM driver module 1125, the analog front-end module 1126, the write strategy module 1127, the DSP module 1128, and/or the I/O interface 1129.

The DVD control module 1121 may use the buffer 1122 and/or nonvolatile memory 1123 to store data related to the control and operation of the DVD drive 1118. The buffer 1122 may include DRAM, SDRAM, etc. The nonvolatile memory 1123 may include flash memory (including NAND and NOR flash memory), phase change memory, magnetic RAM, or multi-state memory, in which each memory cell has more than two states. The DVD PCB 1119 includes a power supply 1130 that provides power to the components of the DVD drive 1118.

The DVDA 1120 may include a preamplifier device 1131, a laser driver 1132, and an optical device 1133, which may be an optical read/write (ORW) device or an optical read-only (OR) device. A spindle motor 1134 rotates an optical storage medium 1135, and a feed motor 1136 actuates the optical device 1133 relative to the optical storage medium 1135.

When reading data from the optical storage medium 1135, the laser driver provides a read power to the optical device 1133. The optical device 1133 detects data from the optical storage medium 1135, and transmits the data to the preamplifier device 1131. The analog front-end module 1126 receives data from the preamplifier device 1131 and performs such functions as filtering and A/D conversion. To write to the optical storage medium 1135, the write strategy module 1127 transmits power level and timing data to the laser driver 1132. The laser driver 1132 controls the optical device 1133 to write data to the optical storage medium 1135.

Figure 11D:
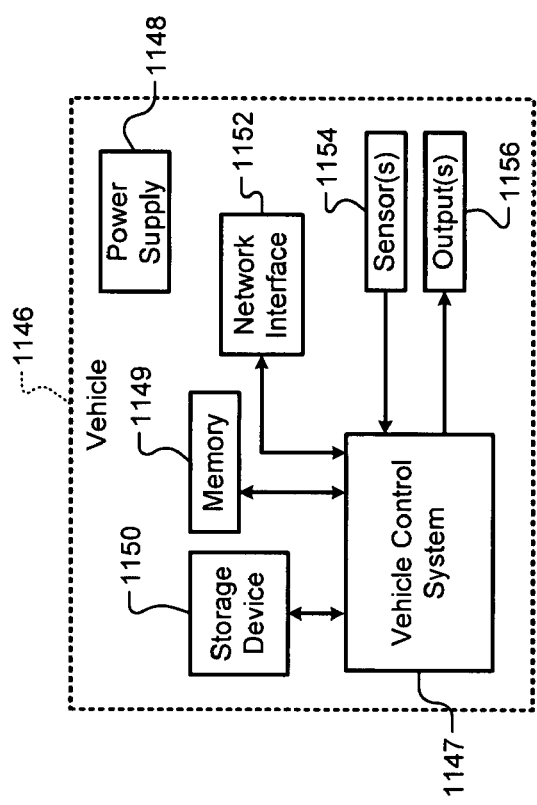
FIG. 11D is a functional block diagram of a vehicle control system.
Figure 11C:
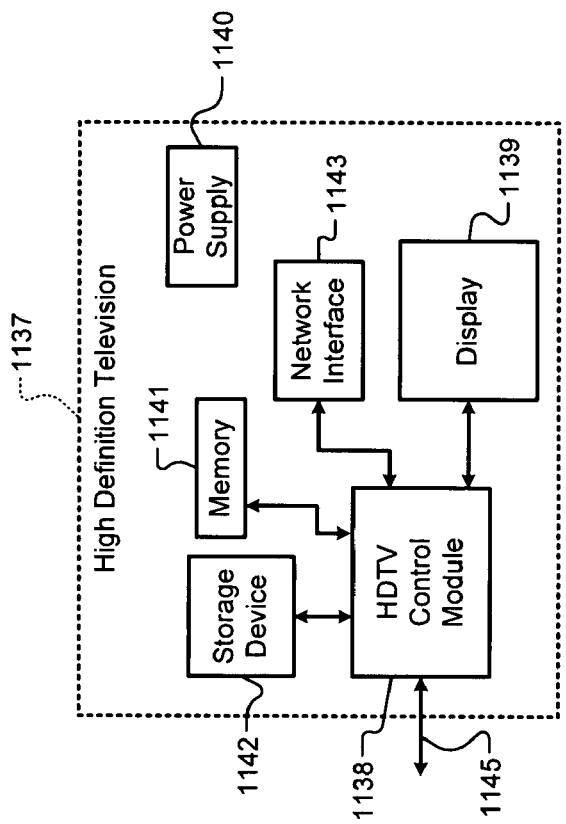
FIG. 11C is a functional block diagram of a high definition television.

Referring now to FIG. 11C, the teachings of the disclosure can be implemented in a DAC of a HDTV control module 1138 of a high definition television (HDTV) 1137. The HDTV 1137 includes the HDTV control module 1138, a display 1139, a power supply 1140, memory 1141, a storage device 1142, a network interface 1143, and an external interface 1145. If the network interface 1143 includes a wireless local area network interface, an antenna (not shown) may be included.

The HDTV 1137 can receive input signals from the network interface 1143 and/or the external interface 1145, which can send and receive data via cable, broadband Internet, and/or satellite. The HDTV control module 1138 may process the input signals, including encoding, decoding, filtering, and/or formatting, and generate output signals. The output signals may be communicated to one or more of the display 1139, memory 1141, the storage device 1142, the network interface 1143, and the external interface 1145.

Memory 1141 may include random access memory (RAM) and/or nonvolatile memory such as flash memory, phase change memory, or multi-state memory, in which each memory cell has more than two states. The storage device 1142 may include an optical storage drive, such as a DVD drive, and/or a hard disk drive (HDD). The HDTV control module 1138 communicates externally via the network interface 1143 and/or the external interface 1145. The power supply 1140 provides power to the components of the HDTV 1137.

Referring now to FIG. 11D, the teachings of the disclosure may be implemented in a DAC of a vehicle control system 1147 of a vehicle 1146. The vehicle 1146 may include the vehicle control system 1147, a power supply 1148, memory 1149, a storage device 1150, and a network interface 1152. If the network interface 1152 includes a wireless local area network interface, an antenna (not shown) may be included. The vehicle control system 1147 may be a powertrain control system, a body control system, an entertainment control system, an anti-lock braking system (ABS), a navigation system, a telematics system, a lane departure system, an adaptive cruise control system, etc.

The vehicle control system 1147 may communicate with one or more sensors 1154 and generate one or more output signals 1156. The sensors 1154 may include temperature sensors, acceleration sensors, pressure sensors, rotational sensors, airflow sensors, etc. The output signals 1156 may control engine operating parameters, transmission operating parameters, suspension parameters, etc.

The power supply 1148 provides power to the components of the vehicle 1146. The vehicle control system 1147 may store data in memory 1149 and/or the storage device 1150. Memory 1149 may include random access memory (RAM) and/or nonvolatile memory such as flash memory, phase change memory, or multi-state memory, in which each memory cell has more than two states. The storage device 1150 may include an optical storage drive, such as a DVD drive, and/or a hard disk drive (HDD). The vehicle control system 1147 may communicate externally using the network interface 1152.

Figure 11E:
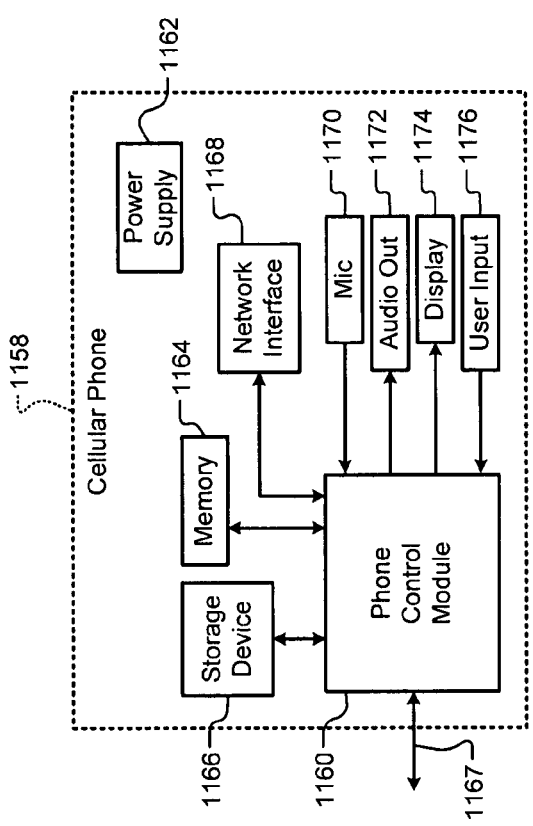
FIG. 11E is a functional block diagram of a cellular phone.

Referring now to FIG. 11E, the teachings of the disclosure can be implemented in a DAC of a phone control module 1160 of a cellular phone 1158. The cellular phone 1158 includes the phone control module 1160, a power supply 1162, memory 1164, a storage device 1166, and a cellular network interface 1167. The cellular phone 1158 may include a network interface 1168, a microphone 1170, an audio output 1172 such as a speaker and/or output jack, a display 1174, and a user input device 1176 such as a keypad and/or pointing device. If the network interface 1168 includes a wireless local area network interface, an antenna (not shown) may be included.

The phone control module 1160 may receive input signals from the cellular network interface 1167, the network interface 1168, the microphone 1170, and/or the user input device 1176. The phone control module 1160 may process signals, including encoding, decoding, filtering, and/or formatting, and generate output signals. The output signals may be communicated to one or more of memory 1164, the storage device 1166, the cellular network interface 1167, the network interface 1168, and the audio output 1172.

Memory 1164 may include random access memory (RAM) and/or nonvolatile memory such as flash memory, phase change memory, or multi-state memory, in which each memory cell has more than two states. The storage device 1166 may include an optical storage drive, such as a DVD drive, and/or a hard disk drive (HDD). The power supply 1162 provides power to the components of the cellular phone 1158.

Figure 11F:
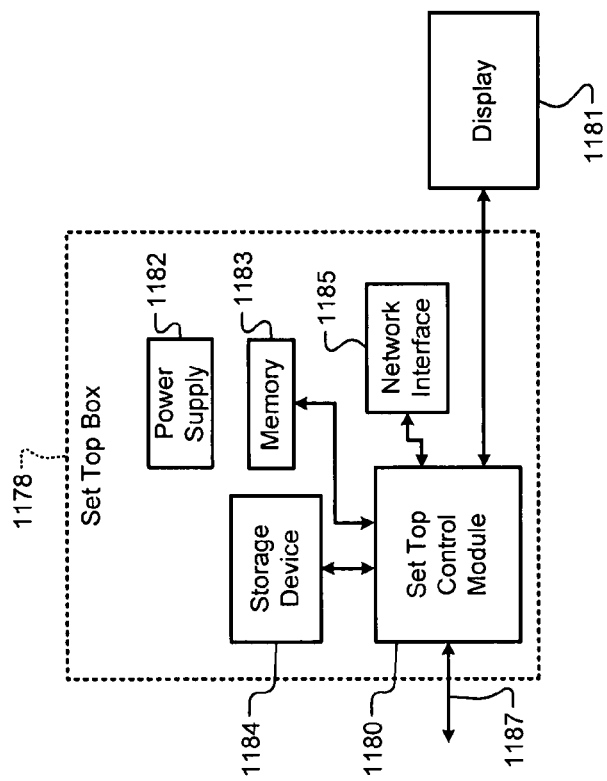
FIG. 11F is a functional block diagram of a set top box.

Referring now to FIG. 11F, the teachings of the disclosure can be implemented in a DAC of a set top control module 1180 of a set top box 1178. The set top box 1178 includes the set top control module 1180, a display 1181, a power supply 1182, memory 1183, a storage device 1184, and a network interface 1185. If the network interface 1185 includes a wireless local area network interface, an antenna (not shown) may be included.

The set top control module 1180 may receive input signals from the network interface 1185 and an external interface 1187, which can send and receive data via cable, broadband Internet, and/or satellite. The set top control module 1180 may process signals, including encoding, decoding, filtering, and/or formatting, and generate output signals. The output signals may include audio and/or video signals in standard and/or high definition formats. The output signals may be communicated to the network interface 1185 and/or to the display 1181. The display 1181 may include a television, a projector, and/or a monitor.

The power supply 1182 provides power to the components of the set top box 1178. Memory 1183 may include random access memory (RAM) and/or nonvolatile memory such as flash memory, phase change memory, or multi-state memory, in which each memory cell has more than two states. The storage device 1184 may include an optical storage drive, such as a DVD drive, and/or a hard disk drive (HDD).

Figure 11G:
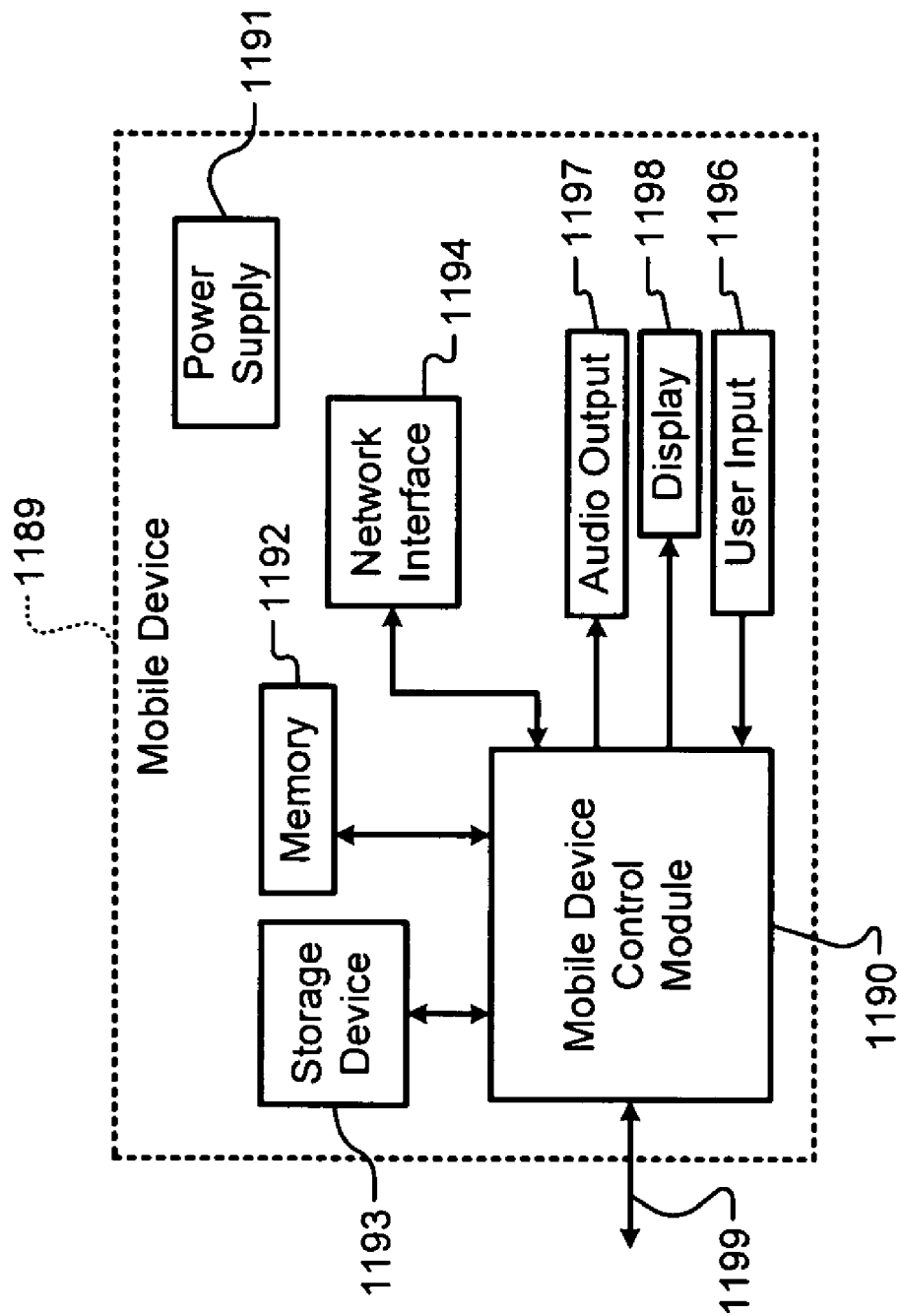
FIG. 11G is a functional block diagram of a mobile device.

Referring now to FIG. 11G, the teachings of the disclosure can be implemented in a DAC of a mobile device control module 1190 of a mobile device 1189. The mobile device 1189 may include the mobile device control module 1190, a power supply 1191, memory 1192, a storage device 1193, a network interface 1194, and an external interface 1199. If the network interface 1194 includes a wireless local area network interface, an antenna (not shown) may be included.

The mobile device control module 1190 may receive input signals from the network interface 1194 and/or the external interface 1199. The external interface 1199 may include USB, infrared, and/or Ethernet. The input signals may include compressed audio and/or video, and may be compliant with the MP3 format. Additionally, the mobile device control module 1190 may receive input from a user input 1196 such as a keypad, touchpad, or individual buttons. The mobile device control module 1190 may process input signals, including encoding, decoding, filtering, and/or formatting, and generate output signals.

The mobile device control module 1190 may output audio signals to an audio output 1197 and video signals to a display 1198. The audio output 1197 may include a speaker and/or an output jack. The display 1198 may present a graphical user interface, which may include menus, icons, etc. The power supply 1191 provides power to the components of the mobile device 1189. Memory 1192 may include random access memory (RAM) and/or nonvolatile memory such as flash memory, phase change memory, or multi-state memory, in which each memory cell has more than two states. The storage device 1193 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system comprising:
    a digital-to-analog converter (DAC) that receives a digital input word; and
    a scrambling module that randomly selects at least one of a plurality of current sources based on said digital input word,
    wherein said scrambling module includes a scrambling row decoder module that decodes and scrambles a row group of bits of said digital input word, and
    wherein said DAC outputs an analog signal based on said at least one of said plurality of current sources.

2. The system of claim 1, wherein:
    said scrambling row decoder module generates a pair of row control signals based on said scrambled row group of bits; and
    said at least one of said plurality of current sources is selected based on said pair of row control signals.

3. The system of claim 1, wherein said scrambling row decoder module includes a binary-thermometer (B/T) scrambling row decoder module.

4. The system of claim 1, wherein said scrambling module includes a scrambling column decoder module that decodes and scrambles a column group of bits of said digital input word.

5. The system of claim 4, wherein said scrambling column decoder module generates a column control signal based on said scrambled column group of bits, and said at least one of said plurality of current sources is selected based on said column control signal.

6. The system of claim 4, wherein said scrambling column decoder module includes a binary-thermometer (B/T) scrambling column decoder module.

7. The system of claim 2, wherein said scrambling row decoder module includes a previous row scrambling module that generates a previous row control signal of said pair of row control signals based on said row group of bits and a set of row pseudo-random sequences, wherein said at least one of said plurality of current sources is selected when said previous row control signal is active.

8. The system of claim 7, wherein said scrambling row decoder module includes a present row scrambling module that generates a present row control signal of said pair of row control signals based on said row group of bits and said set of row pseudo-random sequences, wherein said at least one of said plurality of current sources is selected when said present row control signal and said previous row control signal are active.

9. The system of claim 8, wherein:
said previous row scrambling module and said present row scrambling module respectively include a set of previous row sum modules and a set of present row sum modules; and
each of said set of previous row sum modules and said set of present row sum modules respectively generate a carry up output and a carry down output based on said row group of bits, said set of row pseudo-random sequences, and a respective carry input.

10. The system of claim 9, wherein said previous row scrambling module receives a first carry input, and said present row scrambling module receives a second carry input.

11. The system of claim 9 wherein each of said previous row sum modules respectively correspond to each of said present row sum modules to form pairs of sum modules.

12. The system of claim 11, wherein each of said pairs of sum modules respectively receives one of said row group of bits and one of said set of row pseudo-random sequences.

13. The system of claim 9, wherein each of said previous row sum modules and each of said present row sum modules respectively outputs said one of said row group of bits at said carry up output and outputs said respective carry input at said carry down output when one of said set of row pseudo-random sequences equals zero.

14. The system of claim 9 wherein each of said previous row sum modules and each of said present row sum modules respectively outputs said one of said row group of bits at said carry down output and outputs said respective carry input at said carry up output when one of said set of row pseudo-random sequences equals one.

15. A system comprising:
digital-to-analog conversion means for receiving a digital input word; and
scrambling means for randomly selecting at least one of a plurality of current sources based on said digital input word,
wherein said scrambling means includes scrambling row decoder means for decoding and scrambling a row group of bits of said digital input word, and
wherein said digital-to-analog conversion means outputs an analog signal based on said at least one of said plurality of current sources.

16. The system of claim 15, wherein:
said scrambling row decoder means generates a pair of row control signals based on said scrambled row group of bits; and
said at least one of said plurality of current sources is selected based on said pair of row control signals.

17. The system of claim 15, wherein said scrambling row decoder means includes binary-thermometer (B/T) scrambling row decoder means.

18. The system of claim 15, wherein said scrambling means includes scrambling column decoder means for decoding and scrambling a column group of bits of said digital input word.

19. The system of claim 18, wherein said scrambling column decoder means generates a column control signal based on said scrambled column group of bits, and said at least one of said plurality of current sources is selected based on said column control signal.

20. The system of claim 18, wherein said scrambling column decoder means includes binary-thermometer (B/T) scrambling column decoder means.

21. The system of claim 16, wherein said scrambling row decoder means includes previous row scrambling means for generating a previous row control signal of said pair of row control signals based on said row group of bits and a set of row pseudo-random sequences, wherein said at least one of said plurality of current sources is selected when said previous row control signal is active.

22. The system of claim 21, wherein said scrambling row decoder means includes present row scrambling means for generating a present row control signal of said pair of row control signals based on said row group of bits and said set of row pseudo-random sequences, wherein said at least one of said plurality of current sources is selected when said present row control signal and said previous row control signal are active.

23. The system of claim 22, wherein said previous row scrambling means and said present row scrambling means respectively include a set of previous row sum means and a set of present row sum means and each of said set of previous row sum means and said set of present row sum means respectively generate a carry up output and a carry down output based on said row group of bits, said set of row pseudo-random sequences, and a respective carry input.

24. The system of claim 23, wherein said previous row scrambling means receives a first carry input and said present row scrambling means receives a second carry input.

25. The system of claim 23, wherein each of said previous row sum means respectively correspond to each of said present row sum means to form pairs of sum means.

26. The system of claim 25, wherein each of said pairs of sum means respectively receives one of said row group of bits and one of said set of row pseudo-random sequences.

27. The system of claim 23, wherein each of said previous row sum means and each of said present row sum means respectively outputs said one of said row group of bits at said carry up output and outputs said respective carry input at said carry down output when one of said set of row pseudo-random sequences equals zero.

28. The system of claim 23, wherein each of said previous row sum means and each of said present row sum means respectively outputs said one of said row group of bits at said carry down output and outputs said respective carry input at said carry up output when one of said set of row pseudo-random sequences equals one.

29. A scrambling method for a digital-to-analog converter (DAC), the method comprising:
receiving a digital input word;
randomly selecting at least one of a plurality of current sources based on said digital input word, wherein said randomly selecting includes decoding and scrambling a row group of bits of said digital input word; and
outputting an analog signal based on said at least one of said plurality of current sources.

30. The method of claim 29, further comprising:
generating a pair of row control signals based on said scrambled row group of bits; and
selecting said at least one of said plurality of current sources based on said pair of row control signals.

31. The method of claim 29, further comprising decoding and scrambling a column group of bits of said digital input word.

32. The method of claim 31, further comprising:
generating a column control signal based on said scrambled column group of bits; and
selecting said at least one of said plurality of current sources based on said column control signal.

33. The method of claim 30, further comprising generating a previous row control signal of said pair of row control signals based on said row group of bits and a set of row pseudo-random sequences, wherein said at least one of said plurality of current sources is selected when said previous row control signal is active.

34. The method of claim 33, further comprising generating a present row control signal of said pair of row control signals based on said row group of bits and said set of row pseudo-random sequences, wherein said at least one of said plurality of current sources is selected when said present row control signal and said previous row control signal are active.

35. The method of claim 34, further comprising generating a carry up output and a carry down output based on said row group of bits, said set of row pseudo-random sequences, and a respective carry input.

36. The method of claim 35, further comprising receiving a first carry input and receiving a second carry input.

37. The method of claim 35, wherein each of said pairs of sum modules respectively receives one of said row group of bits and one of said set of row pseudo-random sequences.

38. The method of claim 35, wherein each of said previous row sum modules and each of said present row sum modules respectively outputs said one of said row group of bits at said carry up output and outputs said respective carry input at said carry down output when one of said set of row pseudo-random sequences equals zero.

39. The method of claim 35, wherein each of said previous row sum modules and each of said present row sum modules respectively outputs said one of said row group of bits at said carry down output and outputs said respective carry input at said carry up output when one of said set of row pseudo-random sequences equals one.

* * * * *

UNITED STATES PATENT AND TRADEMARK OFFICE
CERTIFICATE OF CORRECTION

PATENT NO. : 7,586,429 B2
APPLICATION NO. : 11/789196
DATED : September 8, 2009
INVENTOR(S) : Cesura et al.

It is certified that error appears in the above-identified patent and that said Letters Patent is hereby corrected as shown below:

The title page, Item (12) and (75) delete "Cerusa et al." and insert Item (12) and (75) --Cesura et al.--

Signed and Sealed this

Twenty-seventh Day of October, 2009

David J. Kappos
*Director of the United States Patent and Trademark Office*